(12) United States Patent
Price

(10) Patent No.: US 6,453,456 B1
(45) Date of Patent: Sep. 17, 2002

(54) SYSTEM AND METHOD FOR INTERACTIVE IMPLEMENTATION AND TESTING OF LOGIC CORES ON A PROGRAMMABLE LOGIC DEVICE

(75) Inventor: Timothy O. Price, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/533,091

(22) Filed: Mar. 22, 2000

(51) Int. Cl.$^7$ ............................................. G06F 17/50
(52) U.S. Cl. ........................................... 716/16; 716/17
(58) Field of Search ............................ 716/1, 2, 4, 6, 716/16, 17, 18; 326/37, 38, 39, 40; 703/13, 15, 19, 20

(56) References Cited

U.S. PATENT DOCUMENTS

| | | | |
|---|---|---|---|
| 5,636,368 A | * | 6/1997 | Harrison et al. .............. 326/38 |
| 5,946,219 A | * | 8/1999 | Mason et al. ................. 716/16 |
| 6,026,230 A | * | 2/2000 | Lin et al. ...................... 703/13 |
| 6,216,259 B1 | * | 4/2001 | Guccione et al. ............. 716/17 |
| 6,230,307 B1 | * | 5/2001 | Davis et al. .................. 326/37 |

* cited by examiner

*Primary Examiner*—Matthew Smith
*Assistant Examiner*—Paul Dinh
(74) *Attorney, Agent, or Firm*—LeRoy D. Maunu; Lois D. Cartier

(57) ABSTRACT

A system and method for developing a circuit design for a programmable logic device. A tool is provided for interactively modifying a configuration bitstream, downloading the bitstream to a programmable logic device (PLD), and reading back and displaying state information from the PLD. In one embodiment, the tool is command driven. Responsive to a first command, the tool implements a selected logic core from a library of run-time parameterizable logic cores in a configuration bitstream. The bitstream can be automatically downloaded to the PLD as part of the first command, or alternatively, using a separate command. A second command is available for applying a clock signal to the PLD. After application of the clock signal, the states of selected elements implemented by the logic core are reported.

27 Claims, 6 Drawing Sheets

SYSTEM AND METHOD FOR INTERACTIVE IMPLEMENTATION AND TESTING OF LOGIC CORES ON A PROGRAMMABLE LOGIC DEVICE

RELATED PATENT APPLICATION

The present application is related to the following patent applications:

U.S. patent application Ser. No. 09/168,300, entitled "CONFIGURATION OF PROGRAMMABLE LOGIC DEVICES WITH ROUTING CORES" by Guccione and Levi, which was filed on Oct. 7, 1998 and issued as U.S. Pat. No. 6,216,259 on Apr. 10, 2001;

U.S. patent application Ser. No. 09/501,356, entitled "RUN-TIME ROUTING FOR PROGRAMMABLE LOGIC DEVICES" by Keller, Guccione, and Levi, which was filed on Feb. 9, 2000; and U.S. patent application Ser. No. 09/533,092, entitled, "METHOD AND APPARATUS FOR DEFINING AND MODIFYING CONNECTIONS BETWEEN LOGIC CORES IMPLEMENTED ON PROGRAMMABLE LOGIC DEVICES" by Keller and Patterson, which was filed concurrently with the present application.

GOVERNMENT CONTRACT

The U.S. Government has a paid-up license in this invention and the right in limited circumstances to require the patent owner to license others on reasonable terms as provided for by the terms of DABT63-99-3-0004 awarded by DARPA.

FIELD OF THE INVENTION

The present invention generally relates to configuring programmable logic devices and testing designs implemented thereon, and more particularly to interactively implementing and testing logic cores on a programmable logic device.

BACKGROUND

Logic cores are generally used as building blocks in creating electronic circuit designs. A logic core typically is a design that when implemented in hardware performs a predetermined function and that has input and output signal lines that can be connected to other logic. For example, one particular logic core may implement a digital filter, and another logic core may implement a constant multiplier.

The traditional tools for creating logic cores generally support design entry via schematics or a hardware description language such as HDL or VHDL. In addition, there are a multitude of proprietary languages for creating logic cores that are specifically suitable for a particular family of devices. Some environments, for example VHDL, support creation of test environments along with the designs themselves.

In the context of programmable logic devices, for example, field programmable gate arrays (FPGAs) from Xilinx, there are numerous tools available for testing the functionality of circuits created from logic cores. The tools include functional and physical simulators, BoardScope™ graphical debugger software, and XHWIF hardware interface software.

New developments in the area of creating designs for PLDs are rendering the known test methodologies and tools inadequate. For example, circuit designs, including run-time parameterizable logic cores, can be created in the JBits environment from Xilinx. The JBits environment is a Java-based tool that includes an application programming interface (API) that allows designers to develop logic and write a configuration bitstream directly to a Xilinx FPGA. The JBits API permits the FPGA bitstream to be modified quickly, allowing for fast reconfiguration of the FPGA. With Virtex™ FPGAs, the JBits API can be used to partially or fully reconfigure the internal logic of the hardware device. The JBits environment also supports run-time reconfiguration of FPGAs and also configuration of FPGAs over a communications network, for example, an intranet or the Internet.

The JBits environment can also be used to create a suitable test bench for a circuit design. The drawback, however, is that if during testing it becomes desirable to change the parameterization of a logic core to something other than that which was initially programmed in JBits, the JBits program that implements the logic core must be changed to accommodate the new parameter(s). Changing the JBits program requires both knowledge of the JBits environment and knowledge of how the logic core has been programmed with JBits. This added level of complexity and additional consumption of time may be undesirable from the viewpoint of one testing and debugging the circuit implementation on the FPGA.

A system and method that addresses the aforementioned problems, as well as other related problems, is therefore desirable.

SUMMARY OF THE INVENTION

A system and method for developing a circuit design for a programmable logic device are provided in various embodiments. In one embodiment, a tool is provided for interactively modifying a configuration bitstream, downloading the bitstream to a programmable logic device (PLD), and reading back and displaying state information from the PLD. The tool allows a designer to interactively generate a test configuration bitstream, advance the PLD clock, and observe the states of elements in the PLD. The test configuration bitstream can then be interactively modified using the tool and a test sequence repeated.

In one embodiment, the tool is command driven. Responsive to a first command, the tool implements a selected logic core from a library of run-time parameterizable logic cores in a configuration bitstream. The bitstream is downloaded to the PLD. In one embodiment, the bitstream is downloaded in response to the first command, and in another embodiment, the bitstream is downloaded responsive to another command. A second command is available for applying a clock signal to the PLD. After application of the clock signal, states of selected elements implemented by the logic core are reported.

It will be appreciated that various other embodiments are set forth in the Detailed Description and Claims that follow.

BRIEF DESCRIPTION OF THE DRAWINGS

Various aspects and advantages of the invention will become apparent upon review of the following detailed description and upon reference to the drawings, in which.

DETAILED DESCRIPTION

Various embodiments of the present invention are described in terms of extensions to the JBits software, which is available from Xilinx. While the invention is not limited in scope to JBits, the various embodiments are presented in terms of specific examples involving the JBits programming environment. Those skilled in the art will appreciate that the invention could be implemented in other programming languages, applied to programmable logic devices (PLDs) other than FPGAS, and/or adapted to applications that are not run-time reconfigurable.

Figure 1:
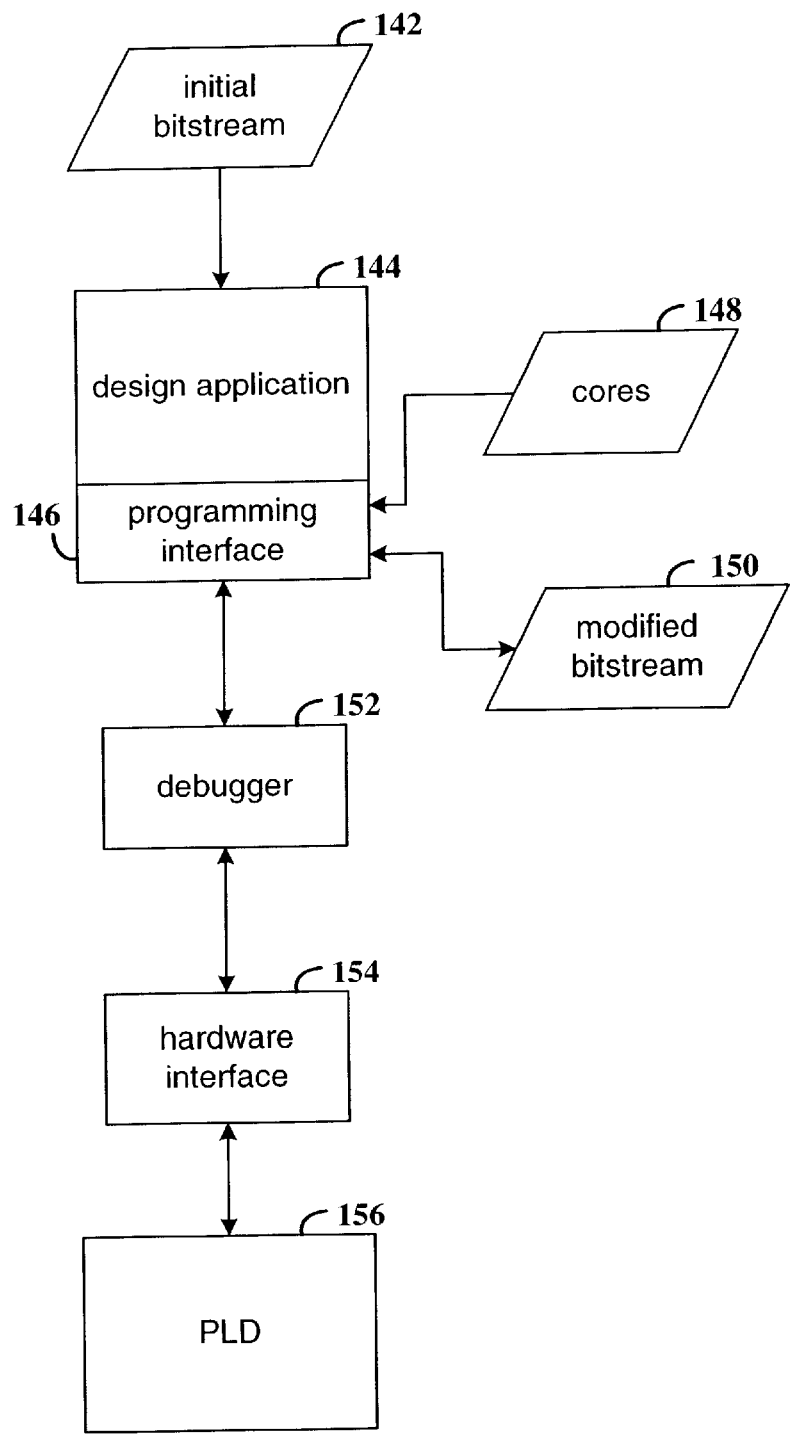
FIG. 1 is a flow diagram that illustrates an example design and test flow.

FIG. 1 is a flow diagram that illustrates an example design and test flow in an environment such as that supported by the JBits software. An initial bitstream 142 is provided as input to design application 144. The initial bitstream is one created using conventional tools, for example, and the design application is a Java program that uses the JBits programming interface 146. The initial bitstream may also be empty, with modified bitstream 150 created entirely by design application 144. Design application 144 uses logic cores 148 in creating modified configuration bitstream 150. Programming interface 146 and hardware interface 154 are then used to configure PLD 156 with bitstream 150.

Once PLD 156 is configured with bitstream 150, debugger 152, such as BoardScope from Xilinx, can be used in conjunction with a hardware interface 154 to test the operation of the implemented circuit. It will be appreciated, however, that while BoardScope allows a user to observe the states of elements within PLD 156 (e.g., flip-flop states within configurable logic blocks (CLBs)), the user cannot manipulate the configuration bitstream via BoardScope. If during testing a change to bitstream 150 is desired that is beyond that for which application 144 is programmed, application 144 must be reprogrammed to effect the change.

Hardware interface 154 can be implemented with the XHWIF hardware interface from Xilinx, for example. XHWIF provides a Java interface for communicating with FPGA-based boards and includes methods for reading and writing bitstreams from and to FPGAs and methods for describing the kinds and number of FPGAs on a board. In addition, XHWIF includes methods for advancing the on-board clock and reading and writing board memories.

Figure 2:
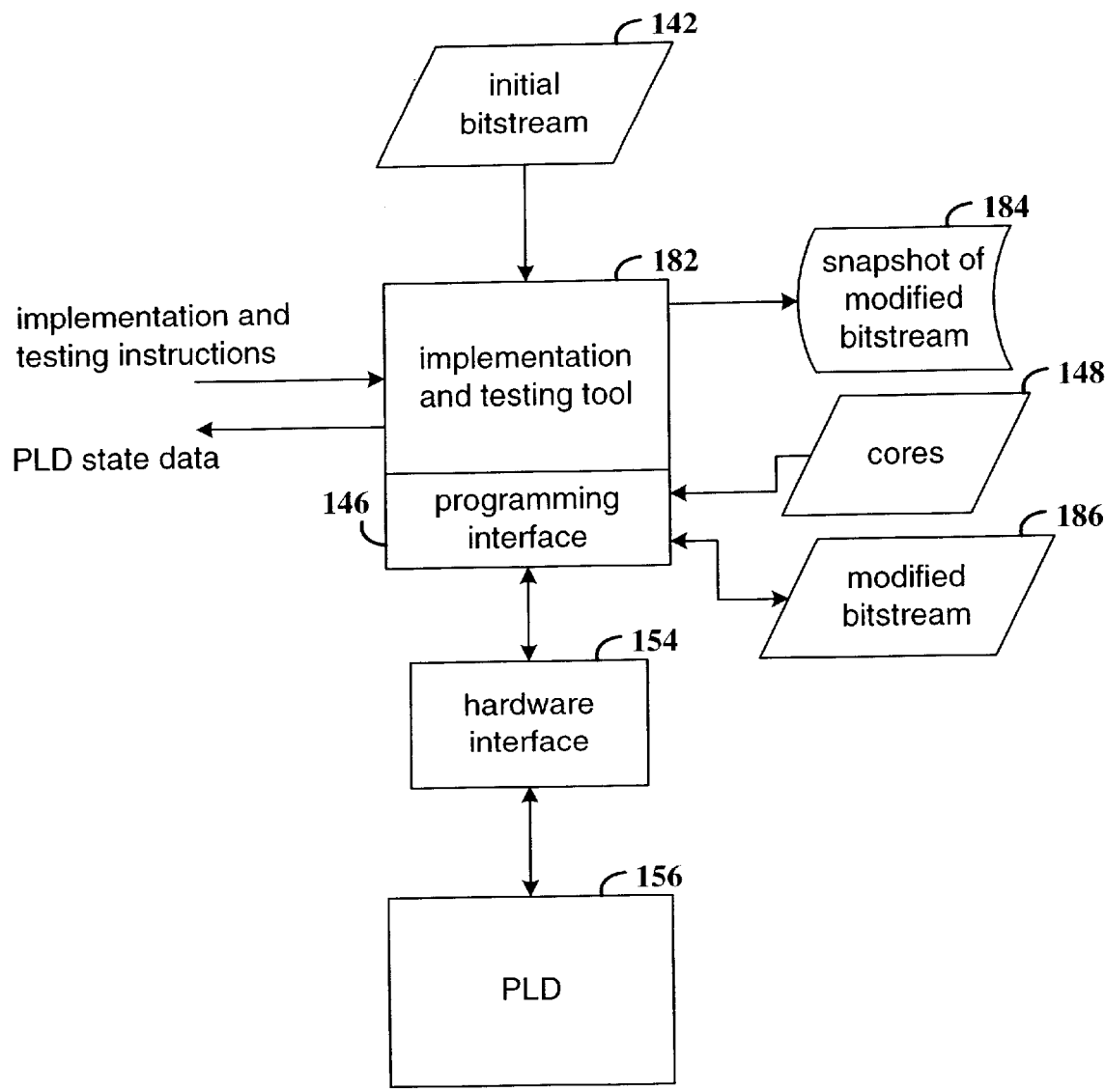
FIG. 2 is a design and test flow diagram in which a user can interactively observe the behavior of the circuit implemented on a PLD and interactively change the configuration bitstream.

FIG. 2 is a design and test flow diagram in which a user can interactively observe the behavior of the circuit implemented on a PLD and interactively change the configuration bitstream. For example, based on the observed states of PLD 156, it may be desirable to change the parameterization of selected cores and create a new configuration bitstream, download the new bitstream, and observe the states of PLD 156 with the new bitstream.

In one embodiment, implementation and testing tool 182 is an interactive program implemented in Java using the JBits application program interface. In response to user-entered commands, tool 182 begins with initial bitstream 142 and creates modified bitstream 186. The initial bitstream may be null or implement logic necessary to test selected ones of cores 148, depending on the functionality of the cores to be tested. A library of run-time parameterizable (RTP) cores 148 is used by tool 182 in creating the modified bitstream.

Implementation and testing tool 182 provides a command-driven interface in which commands can be entered via a computer keyboard by a user or by a script file containing a sequence of commands. Those skilled in the art will appreciate that the commands could also be generated in response to user interaction with a graphical or voice-driven user interface, or using other methods.

The available commands provide the capability to instantiate RTP cores in a bitstream, remove RTP cores from a bitstream, report the states of flip-flops of RTP cores when implemented on the PLD, advance the clock signal on the board having the PLD, save the current bitstream for later use (bitstream 184), and reset the PLD to a known initial state. Selected ones of the commands are described in conjunction with the following flowcharts.

Figure 3:
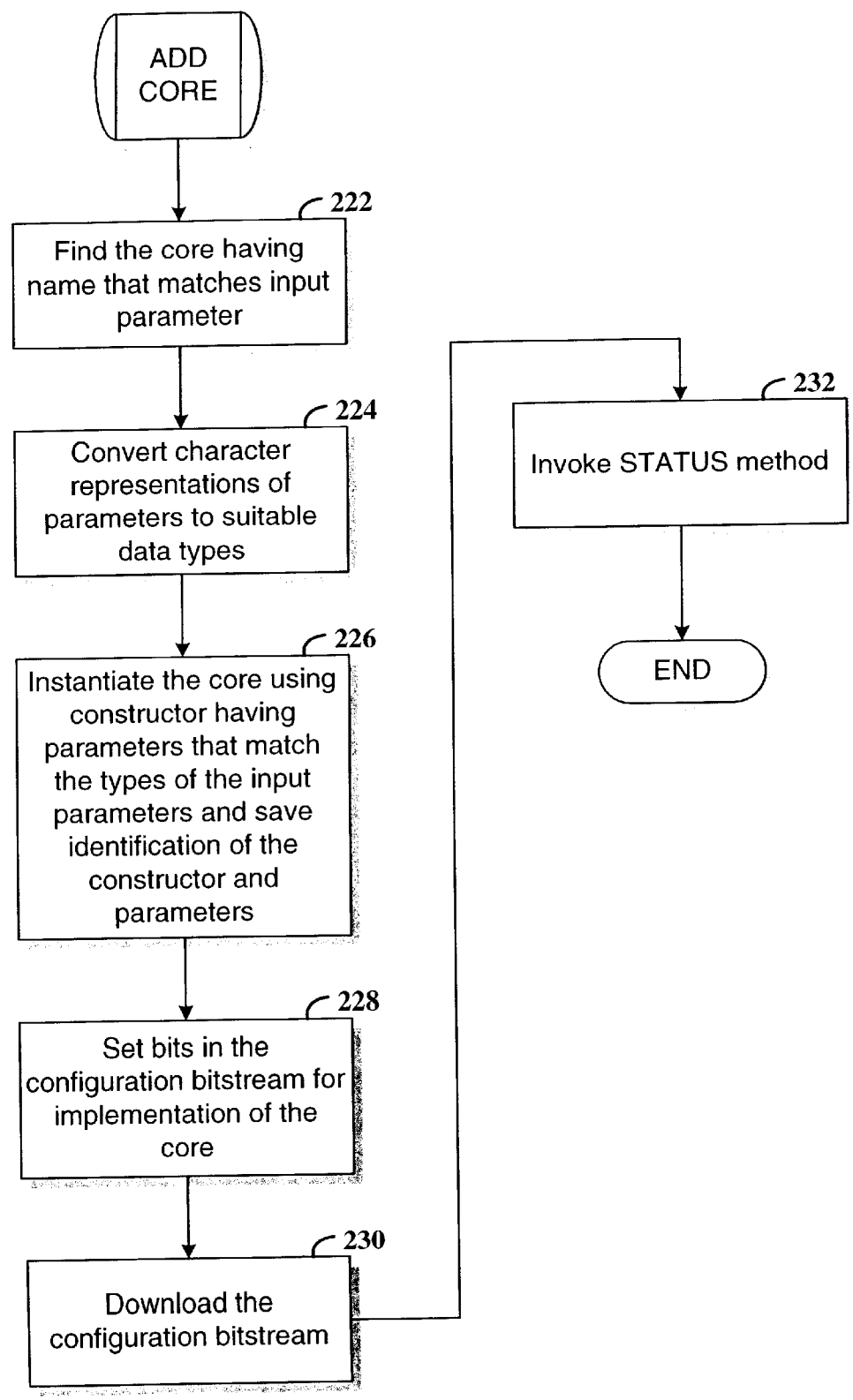
FIG. 3 is a flow chart that illustrates a method for implementing the ADD core command.

FIG. 3 is a flow chart that illustrates a method for implementing the ADD command. The ADD command instantiates a specified core in the configuration bitstream 186 and downloads the modified bitstream to the PLD.

The Java Reflection API is used in the dynamic location of cores. Any Java class file that extends the core class is identified in a master list (not shown) of cores. The master list is generated when tool 182 is first started. Once the master list is generated, APIs of the different Java classes (RTP cores) are used to obtain information pertaining to the class constructors, which provide the numbers and types of the parameters for the various classes.

The ADD command has the following syntax:

ADD<core name> <row> <column> <other parameters>
In processing an ADD command, at step 222, the parameter <core name> is located in the master list. (In the embodiment of FIG. 3, the input parameters are specified with the ADD command instruction. In other embodiments, the input parameters are queried from the user, read from a file, or otherwise obtained prior to step 222.) The parameters <row> and <column> reference coordinates of configurable logic blocks (CLBs) in an FPGA at which the logic core is to be placed. At step 224, the parameters are converted from the character representations to the appropriate data types. Note that error checking includes verifying that the row and column parameters are valid for the particular FPGA.

The core is instantiated at step 226, with the parameters supplied on the command line being used as input parameters to the class constructor. In addition, the identification of the constructor and the associated parameters are saved in a core list (not shown). The core list is used to track which cores are instantiated at run-time with tool 182.

At step 228, the configuration bitstream is updated to implement the referenced core. In the JBits environment, a set method is programmed for each core to generate the proper configuration bits. Tool 182 invokes the set method for the specified core.

At step 230, tool 182 uses hardware interface 154 via programming interface 146 to download the configuration bitstream to PLD 156. The configuration bitstream is then read back from the PLD at step 232 by invoking the STATUS method. Briefly, the STATUS method implements the STATUS command, which is used to read back the configuration bitstream and extract state information of flip-flops of the RTP cores that have been implemented using the ADD command. After reporting the states of the flip-flops, the ADD method is complete.

It will be appreciated that in other embodiments, the download of the configuration bitstream to the PLD is not performed as a part of the ADD command. Rather, a separate command (for example, "CONFIGURE") downloads the configuration bitstream to the PLD. In another embodiment, the ADD method is adapted to process multiple RTP cores as specified in a command.

In another embodiment, a logic core can be placed relative to another core with a PLACE command. The PLACE command can be implemented with the following parameters: <new core>, <anchor core>, <direction>, <alignment>, and other desired parameters. The <new core> is the core to be added at a location relative to the <anchor core>. The <direction> indicates the side on which the <new core> will be placed relative to the <anchor core>, with the direction being one of north, south, east, or west. The <alignment> indicates how the <new core> will be aligned relative to the <anchor core>. For example, if the <direction> is north, then the <alignment> can be left or right, where left means that the left column of CLBs of <new core> will be aligned with the left column of CLBs of <anchor core>. For a <direction> east or west, the <alignment> can be either top or bottom.

Once logic cores have been configured into the configuration bitstream via the ADD command, the cores can be interconnected using stitcher cores, which are described by Guccioni et al in co-pending U.S. patent application Ser. No. 09/168,300. Briefly, stitcher cores are logic cores that specify routing configuration bits. By using the ADD command referencing a stitcher core, the desired connections can be made. In another embodiment, the route methods of the application entitled, "RUN-TIME ROUTING FOR PROGRAMMABLE LOGIC DEVICES", by Keller et al are used to accomplish the desired routing. Such route methods are invoked with a ROUTE command as implemented by tool 182. In still another embodiment, a CONNECT command routes ports of one logic core to ports of another logic core. Usage of logical ports in combination with logic cores is described in the co-pending application entitled, "METHOD AND APPARATUS FOR DEFINING CONNECTIONS BETWEEN LOGIC CORES IMPLEMENTED ON PROGRAMMABLE LOGIC DEVICES", by Keller et al.

Figure 4:
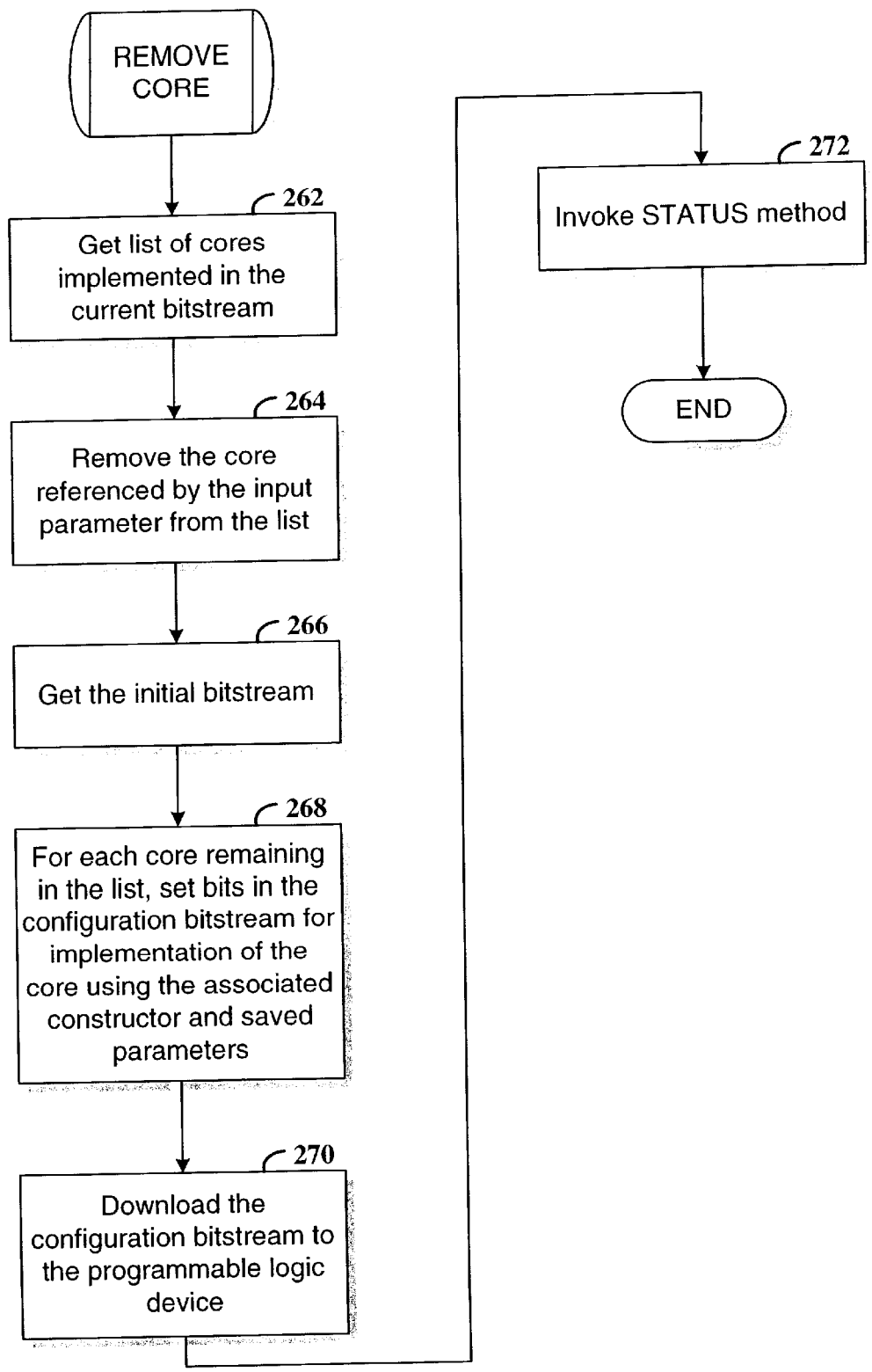
FIG. 4 is a flowchart of a method for implementing the REMOVE core command.

FIG. 4 is a flowchart of a method for implementing the REMOVE command. The REMOVE command is used to remove a specified RTP core from a configuration bitstream. The syntax of the REMOVE command is as follows:

REMOVE <core name> <row> <column>

In the embodiment of FIG. 4, the input parameters are specified with the REMOVE command instruction. In other embodiments, the input parameters are queried from the user, read from a file, or otherwise obtained prior to step 262. At step 262, the core list (as described with the ADD command) is obtained, and at step 264, the constructor of the core referenced by <core name> and having the specified <row> and <column> parameters is removed from the core list.

The initial bitstream is obtained at step 266, in order to rebuild the configuration bitstream using the cores remaining on the core list. At step 268, for each core remaining in the core list, the saved constructor is used to instantiate the core and the associated set method is called to set the appropriate bits in the configuration bitstream. The configuration bitstream is downloaded to the PLD at step 270, and the STATUS method is invoked at step 272 to read back the configuration bitstream and obtain the states of the flip-flops of the RTP cores.

In another embodiment, a core can be removed by resetting the PLD resources used by that core, such as with an UNSET method. A "null" core is used to replace the core to be removed from the configuration bitstream. The null core has no state and is not visible to the STATUS command. In comparison to the REMOVE method, the UNSET method does not destroy the state of the other cores.

Figure 5:
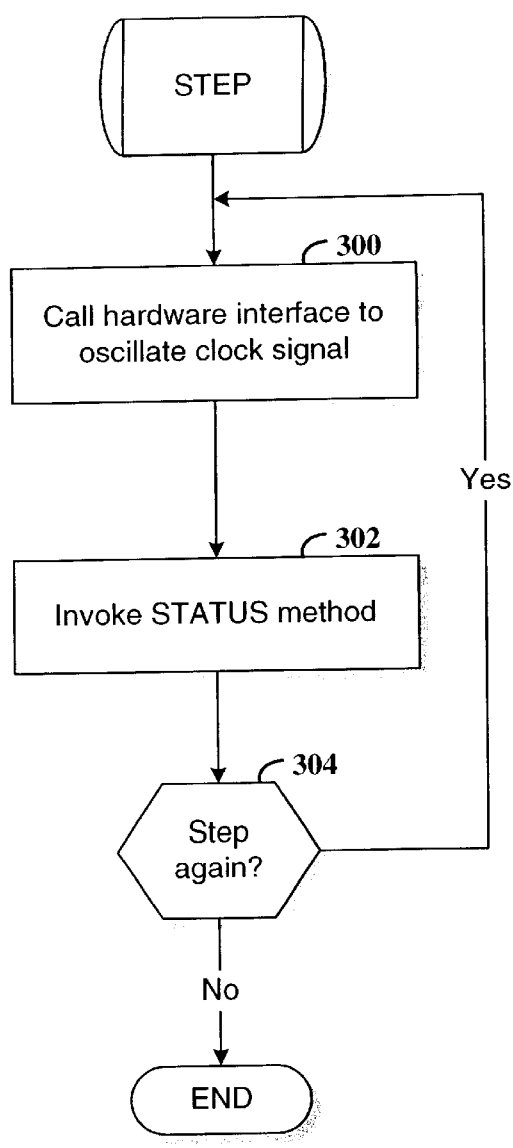
FIG. 5 is a flowchart of a method for advancing a clock signal supplied to a PLD under test in response to a STEP command.

FIG. 5 is a flowchart of a method for advancing a clock signal supplied to a PLD under test. The method implements the STEP command, which has the following syntax:

STEP <number of cycles>

In the embodiment of FIG. 5, the number of cycles is specified with the STEP command instruction. In other embodiments, the number of cycles is queried from the user, read from a file, or otherwise obtained prior to step 300. The number of cycles is then used, for example in a FOR loop, to repeat a sequence of steps (300, 302, 304) the specified number of times.

At step 300, hardware interface 154 is called to oscillate the board clock signal one cycle. The STATUS method is invoked at step 302 to read back the configuration bitstream and display the states of flip-flops after having advanced the clock signal. Decision step 304 tests whether the clock should be stepped again as determined by the <number of cycles> parameter. If so, control is returned to step 300 to oscillate the clock again. Otherwise, the STEP method is complete.

Figure 6:
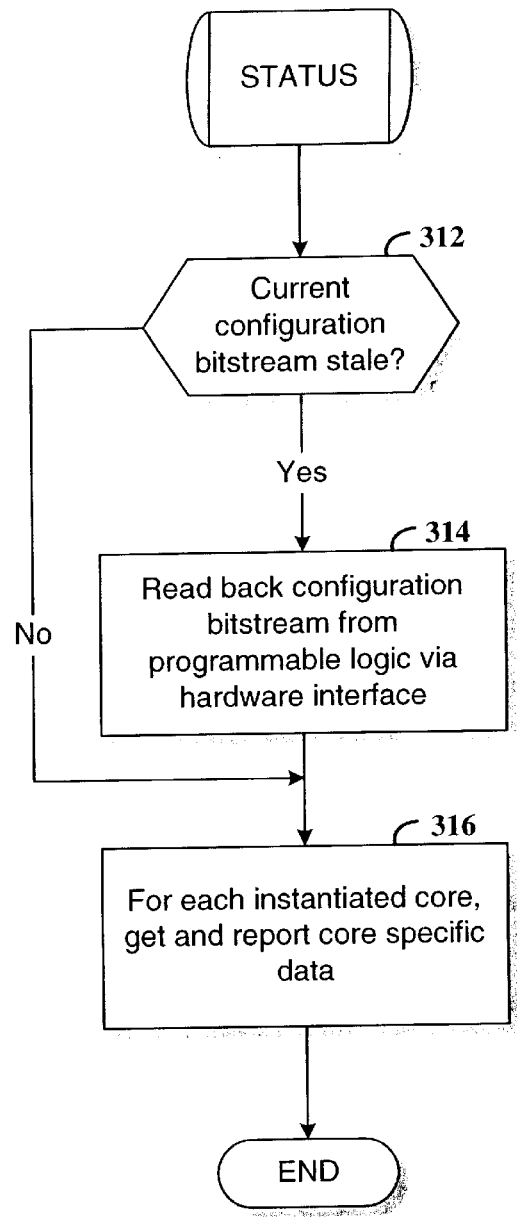
FIG. 6 is a flowchart of a method for implementing the STATUS command.

FIG. 6 is a flowchart of a method for implementing the STATUS command. The STATUS command can be entered by a user to display the states of flip-flops of the implemented RTP cores, and the method is called by the ADD, REMOVE, and STEP methods.

Decision step 312 tests whether the current configuration bitstream has up-to-date state information. The test is accomplished by maintaining a flag that is updated when the STEP method is performed. If the STEP method was invoked since the last time the configuration bitstream was read back from the PLD, then the configuration bitstream is again read back from the PLD at step 314. At step 316, the states of flip-flops in each core that is identified in the core list are extracted from the configuration bitstream and reported to the user. The state information can be extracted by invoking the methods that are provided with each of the Java-implemented RTP cores. Specifically, various "get" methods are invoked to return the height, width, origin row and column, and state. The state information can be inspected by the user to determine whether the core is behaving as expected.

In another embodiment, a separate command named READBACK is implemented to read a configuration bitstream back from a PLD into a bitstream object. In this embodiment, the STATUS command does not initiate reading back the configuration bitstream. Instead, the STATUS command extracts state and other information from a configuration bitstream after the READBACK command has been performed. In this embodiment, the ADD, REMOVE, and STEP commands are adapted accordingly.

In addition to the methods described above, additional methods are implemented to support LIST, SELECT, WRITE, RESET, and EXIT commands.

The LIST command displays a list of the RTP cores and the associated constructors. The list is generated from the information in the master list of RTP cores.

The SELECT command sets a parameter that dictates to which PLD on a board reference is made by the ADD, REMOVE, WRITE, CONFIGURE, and PLACE commands. The STEP and RESET commands are applied to all PLDs on a board.

The WRITE command can be used to write the current configuration bitstream to a file. The bitstream can be used at a later time to initialize a PLD with a configuration bitstream other than the initial bitstream.

The RESET command can be used to place the PLD in a known state. Specifically, the RESET command causes the initial bitstream to be loaded into the PLD and read back.

The EXIT command disconnects the processor hosting tool 182 from the board and causes the tool to terminate.

Figure 7:
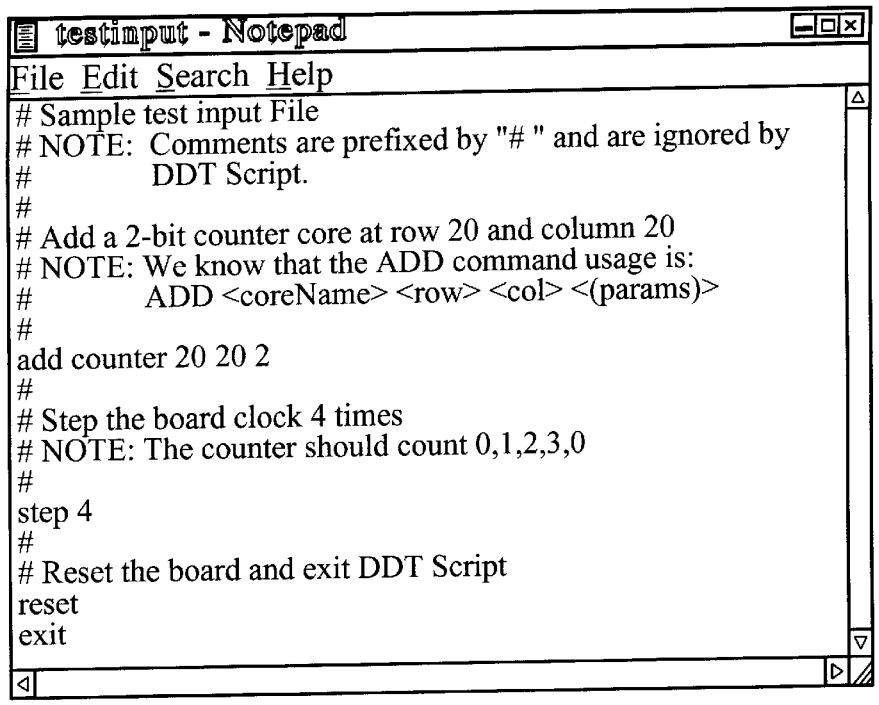
FIG. 7 illustrates a display screen having an example input script of commands.
Figure 8:
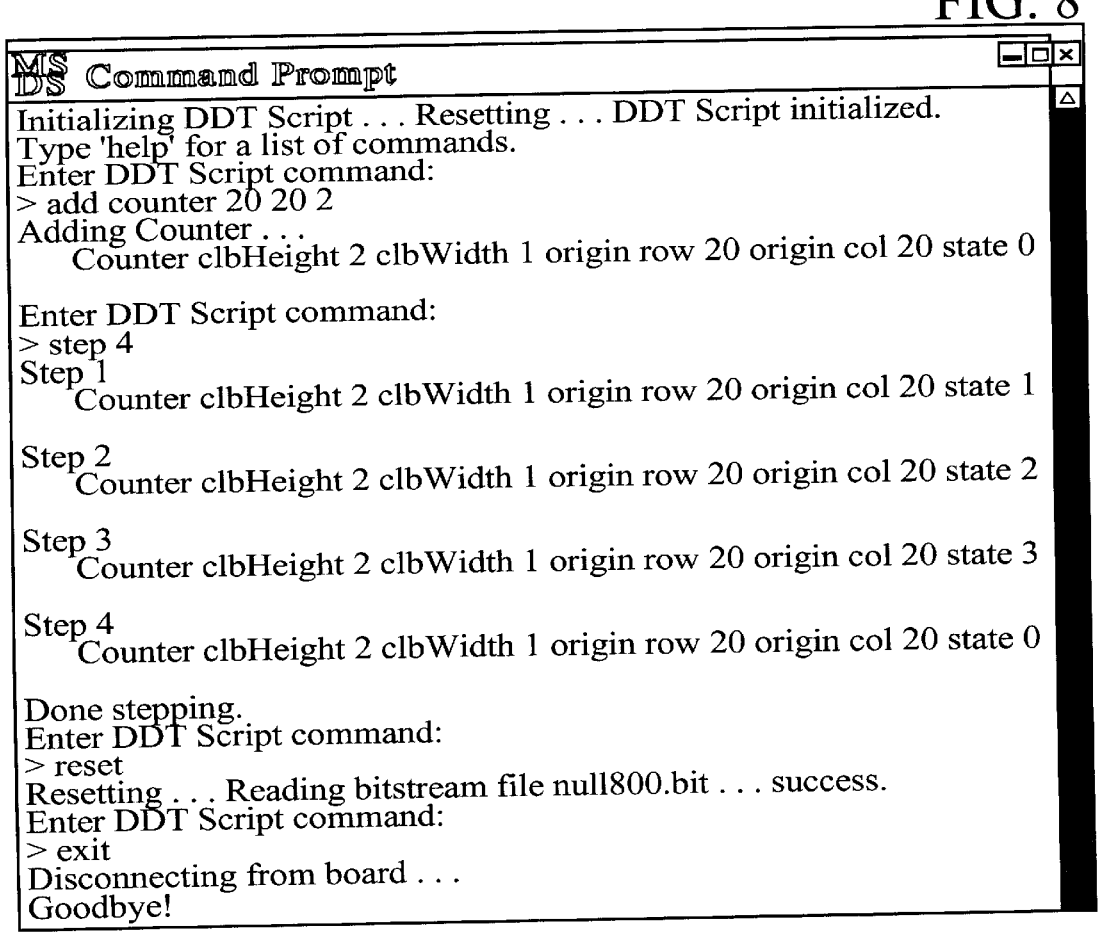
FIG. 8 illustrates a display screen having PLD state data reported to a user in response to executing the example script of FIG. 7.

FIGS. 7 and 8 illustrate a specific example involving an input script of commands (FIG. 7) and the state information (FIG. 8) displayed in response to processing the script of FIG. 7 by tool 182.

The present invention is believed to be applicable to a variety of systems for configuring PLDs and has been found to be particularly applicable and beneficial in configuring FPGAs in a Java-based run-time reconfiguration environment. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for developing a circuit design for a programmable logic device, comprising:

creating a library of one or more run-time parameterizable logic cores;

implementing a selected one of the one or more logic cores in a first configuration bitstream responsive to a first command including parameters that specify the logic core and placement of the core on the programmable logic device;

downloading the first bitstream to the programmable logic device;

responsive to a second command, applying a clock signal to the programmable logic device; and reporting, after application of the clock signal, states of selected elements implemented by the logic core.

2. The method of claim 1, wherein the second command includes a parameter that specifies a number of cycles by which the clock signal is advanced.

3. The method of claim 2, wherein the states of the selected elements are reported after each clock cycle.

4. The method of claim 3, further comprising reading back a readback configuration bitstream from the programmable gate array after each clock cycle.

5. The method of claim 4, further comprising downloading a predefined configuration bitstream to the programmable logic device responsive to a third command, wherein the predefined configuration bitstream configures the programmable logic device in a known state.

6. The method of claim 1, wherein the first bitstream is downloaded to the device responsive to the first command.

7. The method of claim 6, wherein the states of selected elements are reported responsive to the second command.

8. The method of claim 1, wherein the first bitstream is downloaded to the device responsive to a third command.

9. The method of claim 1, wherein the states of selected elements are reported responsive to the second command.

10. The method of claim 1, wherein the states of selected elements are reported responsive to a third command.

11. The method of claim 1, further comprising:

removing an implementation of the logic core from the first configuration bitstream responsive to a third command whereby a modified configuration bitstream is created, wherein the third command includes a parameter that references the logic core to be removed; and downloading the modified configuration bitstream to the programmable logic device.

12. The method of claim 11, wherein the modified configuration bitstream is downloaded responsive to the third command.

13. The method of claim 11, wherein the modified configuration bitstream is downloaded responsive to a fourth command.

14. The method of claim 1, further comprising reading back a readback configuration bitstream from the programmable logic device and reporting states of selected elements that implement one or more logic cores responsive to a third command.

15. The method of claim 1, further comprising receiving the first and second commands from a command line interface.

16. The method of claim 1, further comprising reading the first and second commands from a script file.

17. The method of claim 1, further comprising receiving the first and second commands from a graphical user interface.

18. The method of claim 1, further comprising downloading an initial predefined configuration bitstream to the programmable logic device prior to implementing the logic core.

19. The method of claim 1, wherein the placement parameter includes data identifying a row and a column of a configurable logic block of the programmable logic device.

20. The method of claim 1, further comprising:

constructing one or more logic core definitions using object-oriented classes; and implementing the selected logic core using a class associated with the selected logic core.

21. A computer-implemented method for developing a circuit design for a programmable logic device, comprising:

creating a library of run-time parameterizable logic cores;

supplying a first configuration bitstream;

implementing selected ones of the logic cores in the first configuration bitstream, thereby creating a second configuration bitstream and downloading the second configuration bitstream to the programmable logic device responsive to a set of first commands that include parameters that specify the logic cores and placement of the cores on the programmable logic device;

creating a list identifying the selected ones of the logic cores implemented in the second configuration bitstream and the parameters used to implement the logic cores;

responsive to a second command, applying a clock signal to the programmable logic device and automatically reporting after application of the clock signal states of selected elements implemented by the selected logic cores;

responsive to a third command that includes a parameter that references a logic core to be removed, removing from the list of logic cores the logic core referenced in the third command, implementing in the first configuration bitstream remaining logic cores identified in the list, thereby creating a third configuration bitstream, and thereafter downloading the third configuration bitstream to the programmable logic device.

22. An apparatus for developing a circuit design for a programmable logic device, comprising:

means for creating a library of one or more run-time parameterizable logic cores;

means for implementing a selected one of the one or more logic cores in a configuration bitstream and downloading the bitstream to the programmable logic device responsive to a first command including parameters that specify the selected logic core and placement of the core on the programmable logic device; and means for applying a clock signal to the programmable logic device and automatically reporting after application of the clock signal states of selected elements implemented by the logic core responsive to a second command.

23. A computer-implemented method for developing a circuit design for a programmable logic device, comprising:

creating a library of one or more run-time parameterizable logic cores;

interactively entering a first command including parameters that specify one of the logic cores, placement of the logic core on the programmable logic device, and initial functionality of the logic core, wherein in response the one of the logic cores is implemented in a first configuration bitstream and the first bitstream is downloaded to the programmable logic device;

interactively entering a second command, wherein in response a clock signal input to the programmable logic device is advanced and signal states of selected elements implemented by the logic core are automatically reported after advancing the clock; and interactively entering a third command including parameters that specify the one of the logic cores, placement of the logic core on the programmable logic device, and functionality of the logic core that is different from the initial functionality, wherein in response the one of the logic cores is implemented in a second configuration bitstream and the second bitstream is downloaded to the programmable logic device.

24. The method of claim 23, further comprising interactively entering a fourth command including parameters that specify the one of the logic cores and placement on the programmable logic device, wherein in response the implementation of the one of the logic cores is removed from the second-configuration bitstream, thereby creating a third configuration bitstream, and the third configuration bitstream is thereafter downloaded to the programmable logic device.

25. A system for developing a circuit design for a programmable logic device, comprising:

a library of run-time-parameterizable logic cores;.

a programming interface coupled to the library of logic cores; and an implementation tool configured and arranged to implement selected ones of the logic cores in a configuration bitstream responsive to user-input commands that include parameters that select the logic cores and placement of-the cores on the programmable logic device and automatically download the configuration bitstream to the programmable logic device the implementation tool is further configured and arranged to apply a clock signal to the programmable logic device and automatically report after application of the clock signal states of selected elements implemented by the selected ones of logic cores, responsive to a second command.

26. The system of claim 25, wherein the logic cores in the library are implemented as object oriented classes.

27. The system of claim 26, wherein the object oriented classes are Java classes.

* * * * *